United States Patent
Hung et al.

(10) Patent No.: US 7,084,474 B2
(45) Date of Patent: Aug. 1, 2006

(54) PHOTOSENSITIVE SEMICONDUCTOR PACKAGE AND METHOD FOR FABRICATING THE SAME

(75) Inventors: Chia-Yu Hung, Taichung Hsien (TW); Chien-Ping Huang, Hsinchu Hsein (TW); Ke-Chuan Yang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/959,786

(22) Filed: Oct. 5, 2004

(65) Prior Publication Data

US 2005/0139946 A1    Jun. 30, 2005

(30) Foreign Application Priority Data

Dec. 31, 2003    (CN) .................................. 92137673

(51) Int. Cl.
  *H01L 31/0232*    (2006.01)
  *H01L 31/0203*    (2006.01)
(52) U.S. Cl. ............... 257/434; 257/459; 257/E31.127; 257/E31.117
(58) Field of Classification Search ............... 257/431, 257/433, 434, 435, 459, E31.127, E31.117
See application file for complete search history.

(56) References Cited

U.S. PATENT DOCUMENTS

| | | | |
|---|---|---|---|
| 5,037,779 A | 8/1991 | Whalley et al. | |
| 5,541,284 A | 7/1996 | Arnoldi et al. | |
| 5,821,532 A | 10/1998 | Beaman et al. | |
| 5,828,126 A * | 10/1998 | Thomas | 257/695 |
| 5,865,935 A | 2/1999 | Ozimek et al. | |
| 5,923,958 A | 7/1999 | Chou | |
| 6,034,429 A | 3/2000 | Glenn et al. | |
| 6,303,997 B1 * | 10/2001 | Lee | 257/778 |
| 6,369,116 B1 | 4/2002 | Wong et al. | |
| 6,384,472 B1 | 5/2002 | Huang | |
| 6,483,101 B1 | 11/2002 | Webster | |
| 6,515,269 B1 | 2/2003 | Webster et al. | |
| 6,545,332 B1 | 4/2003 | Huang | |
| 6,548,759 B1 | 4/2003 | Glenn et al. | |
| 6,586,824 B1 | 7/2003 | Glenn et al. | |
| 6,590,269 B1 | 7/2003 | Chuang et al. | |
| 6,603,183 B1 | 8/2003 | Hoffman | |
| 6,646,316 B1 | 11/2003 | Wu et al. | |
| 2001/0050721 A1 * | 12/2001 | Miyake | 348/374 |
| 2002/0171031 A1 | 11/2002 | Kim et al. | |

FOREIGN PATENT DOCUMENTS

JP    2001-068654    3/2001

* cited by examiner

*Primary Examiner*—Eddie Lee
*Assistant Examiner*—Andrew O. Arena
(74) *Attorney, Agent, or Firm*—Peter F. Corless; Steven M. Jensen; Edwards Angell Palmer & Dodge, LLP

(57) ABSTRACT

A photosensitive semiconductor package and a method for fabricating the same are proposed. The package includes a carrier having a first surface, an opposite second surface, and an opening penetrating the carrier; a photosensitive chip having an active surface and a non-active surface, wherein a plurality of bond pads are formed close to edges of the active surface, and the chip is mounted via corner positions of its active surface to the second surface of the carrier, with the bond pads being exposed via the opening; a plurality of bonding wires formed in the opening, for electrically connecting the bond pads of the chip to the first surface of the carrier; a light-penetrable unit attached to the active surface of the chip and received in the opening; and an encapsulant for encapsulating the bonding wires and peripheral sides of the chip to seal the opening.

20 Claims, 12 Drawing Sheets

_US 7,084,474 B2_

PHOTOSENSITIVE SEMICONDUCTOR PACKAGE AND METHOD FOR FABRICATING THE SAME

FIELD OF THE INVENTION

The present invention relates to photosensitive semiconductor packages and methods for fabricating the same, and more particularly, to a photosensitive semiconductor package that is applicable to an image sensor device and uses a wire-bonding technique, and a method for fabricating the semiconductor package.

BACKGROUND OF THE INVENTION

In accordance with improvements in the electronics industry and the emergence of the digital generation, a variety of electronic devices have been developed toward integration of functions so as to incorporate a variety of functions into a single portable device and to enhance users' convenience and overcome spatial limitations. It is certainly a challenge for the electronics industry of the next generation to integrate an image sensor, such as a charge coupled device (CCD) or CMOS sensor coupled to a digital camera, optical scanner, PC camera, toy or fingerprint identifier, into a compact portable device such as a mobile phone or personal digital assistant (PDA), especially for mobile communication devices, such as mobile phones, that have been regularly reduced in volume and thickness with each successive generation of products. Therefore, how to package image sensor chips in such compact mobile communication devices without impeding the size-reduced development of the devices becomes an ultimate challenge in the current packaging technology.

Typically, to package a photosensitive semiconductor chip, it would consider that the chip requires direct receipt of irradiation or light, and the performance thereof should also be protected by preventing external dust or moisture from invading the chip. U.S. Pat. No. 6,384,472 discloses a package incorporated with a photosensitive semiconductor chip. As shown in FIG. 11, the photosensitive semiconductor chip 60 is mounted on a conventional carrier 61 such as a lead frame, and is electrically connected to the carrier 61 via a plurality of bonding wires 62. An encapsulant 64 is formed around the chip 60 and bonding wires 62, and a light-penetrable material 63 such as optical glass is provided as a lid to seal an opening of the encapsulant 64 so as to isolate the chip 60 from external moisture and allow light to reach a photosensitive area 65 of the chip 60 through the light-penetrable material 63.

However, the above packaging method of the photosensitive chip leads to a significant drawback that gradually eliminates the use of this method in fabrication of current compact package products. In particular, the method allows the chip 60 to be mounted on the carrier 61 and then subjected to a wire-bonding process to form the bonding wires 62, and the encapsulant 64 is formed as a dam structure surrounding the chip 60. As a result, besides the width and height of the chip 60 and the light-penetrable material 63, the package size must also include the height H and width W2 of the encapsulant 64 and the wire span W1 of the bonding wires 62. Thus the package is hard to be further reduced in size and has certain space not in use but wasted. Other related prior arts include U.S. Pat. Nos. 6,545,332, 5,541,284, 6,590,269, 6,603,183, 5,037,779, 5,923,958, 5,821,532, 5,865,935, 6,034,429, 6,515,269, and 6,483,101, by which the chip is similarly mounted on the carrier and subjected to the wire-bonding technique in the package. Such package also suffers difficulty in minimizing the dimensions thereof, making it hard for packaging image sensors in future products.

In light of the above drawback, there has proposed an idea of forming an opening in the carrier such as a substrate for accommodating the chip as disclosed in U.S. Pat. No. 6,586,824. As shown in a semiconductor package of FIG. 12C, a substrate 70 is provided with an opening 71 therein, and a photosensitive chip 72 is received in the opening 71 and electrically connected to the substrate 70 by bonding wires 73. A light-penetrable glass 74 is disposed on an active surface 72a of the chip 72. An encapsulant 75 is fabricated to form the package, and a plurality of solder balls 76 are implanted on a surface of the substrate 70 opposite to the bonding wires 73. By this arrangement, the chip 72 can receive external light via the light-penetrable glass 74 and can be electrically connected to an external device (not shown) via the solder balls 76, and the thickness of this package is reduced compared to the above-mentioned package structure. However, as shown in FIG. 12A, during the package fabrication processes before mounting the chip 72, an adhesive tape 77 is attached to the substrate 70 in order to cover one end of the opening 71 of the substrate 70, such that the chip 72 can be accommodated in the opening 71 and attached to the adhesive tape 77 to be fixed in position. After performing the wire-bonding process, the attachment step of the light-penetrable glass 74 and the encapsulation process, as shown in FIG. 12B, the adhesive tape 77 is removed and the ball implantation process is ready to be carried out. Therefore, the package fabrication processes are quite complex and costly to implement. Further, the adhesive tape 77 is only used to position the chip 72 and not present in the final package structure, which thus causes a waste of material cost on the adhesive tape 77 that cannot be reused, and leads to a major loss in commercial scale production. Therefore, although the size-reduction problem is overcome, the above packaging method induces another serious and tough problem.

To address the above problem of positioning the chip in the opening of the carrier, a conventional flip-chip packaging technique is employed for mounting the photosensitive chip as disclosed in U.S. Pat. No. 6,646,316. Referring to FIG. 13, an opening 89a is provided in a carrier 89. A plurality of conductive bumps 86 are formed on an active surface 85a of a photosensitive chip 85 and attached to terminals 87a of a flexible circuit board 87, such that the chip 85 is positioned in the opening 89a of the carrier 89 and electrically connected to the flexible circuit board 87. Light is allowed to go through a light-penetrable plate 88 and an opening of the flexible circuit board 87, which are located above the chip 85, to reach the chip 85. This arrangement advantageously integrates the chip-positioning and electrical connection steps in a single process without using any extra adhesive tape and thus solves the above-mentioned problem. However, since this packaging method uses the flip-chip technique, it would still encounter drawbacks associated with the flip-chip technique. In particular, during formation of the conductive bumps 86 on the chip 85, a multi-layer under bump metallurgy (UBM) structure is fabricated at predetermined positions on the chip 85 and requires complex processes such as exposure, development, etching and solder printing or plating, which would significantly increase the fabrication complexity and material cost. Moreover, the photosensitive chip 85 usually has an extremely high cleanness requirement, especially a photosensitive area on the active surface 85a requiring very rigorous protection against pollution from dust or moisture. Since the formation of conductive bumps 86 involves many steps over long duration, it may cause the photosensitive chip 85 to be contaminated and thus degrade a yield thereof.

Photosensitive semiconductor packages adopting the flip-chip technique are also disclosed in U.S. Pat. Nos. 6,396,116 and 6,548,759, U.S. Patent Publication No. 2002/0171031, and Japanese Patent No. 2001-68654. In these references, either the chip is pre-formed with the conductive bumps, or the light-penetrable glass needs to be formed with conductive circuits and bumps, such that either one technique has the above drawbacks of high cost and low yield. As a result, the photosensitive semiconductor package using the flip-chip technology is still incurred with a significant barrier to the development thereof.

Therefore, in the foregoing photosensitive semiconductor packages, in the case of using the wire-bonding technique for electrical connection of the chip, the package size is difficult to be further reduced; in the case of forming an opening in the carrier to reduce the package thickness, it requires additional processes and cost for using the adhesive tape to position the chip; thus, these are not ideal package designs. On the other hand, if using the more advanced flip-chip technology instead of the wire-bonding technique for the electrical connection in the photosensitive semiconductor package, the complex flip-chip technique would however increase the fabrication cost and is not suitable for the photosensitive chip requiring extreme cleanness. It is believed that the development of photosensitive semiconductor packages is in bottleneck.

Recently, attempts have been tried to solve the two above-mentioned problems by utilizing other types of package configurations to accommodate photosensitive chips. For example, a substrate-on-chip (SOC) package in FIG. 14 has been widely used for packaging other types of chips. As shown in FIG. 14, a substrate 90 is provided with an opening 91 therein. A chip 92 is attached to a bottom surface of the substrate 90, with central bond pads 94 on the chip 92 being exposed via the opening 91. A plurality of bonding wires 93 are formed to electrically connect the central bond pads 94 on the chip to a conductive trace layer 95 on the bottom surface of the substrate 90, and are encapsulated by an encapsulant 96. This packaging method indeed saves space occupied by the bonding wires, and does not require any adhesive tape to position the chip 92 and not have the drawback of high cost caused by the flip-chip technique. Such method thus seems applicable for packaging photosensitive chips and solves the above-mentioned problems. However, in fact this assumption is not correct. As shown in FIG. 15, on the active surface of the photosensitive chip there are normally provided a photosensitive area 97 at a central position for receiving light and a plurality of input/output (I/O) pads 98 at peripheral positions for being connected to bonding wires. Thus, the peripheral area on the active surface of the photosensitive chip is occupied by the I/O pads 98 and cannot be attached to the bottom surface of the substrate 90 (as shown in FIG. 14), and unlike the central bond pads 94 (FIG. 14), the peripheral I/O pads 98 cannot be exposed via the opening 91 of the substrate 90 to be connected to the bonding wires 93. In other words, it is very difficult to incorporate the photosensitive chip in the conventional SOC package as the technical problems required to be solved for packaging the photosensitive chip are much more serious than other types of chips. There is still no ideal packaging technique for photosensitive chips.

Therefore, the problem to be solved here is to provide a photosensitive semiconductor package using a wire-bonding technique and a fabrication method thereof, which can reduce the package size and the fabrication cost, and do not require any adhesive tape or formation of conductive bumps, as well as can achieve large scale production and a satisfactory yield.

SUMMARY OF THE INVENTION

A primary objective of the present invention is to provide a photosensitive semiconductor package and a method for fabricating the same, which can reduce the fabrication cost.

Another objective of the present invention is to provide a thin and compact photosensitive semiconductor package and a method for fabricating the same.

Still another objective of the present invention is to provide a photosensitive semiconductor package and a method for fabricating the same, without formation of conductive bumps in the package.

A further objective of the present invention is to provide a photosensitive semiconductor package and a method for fabricating the same, without using an adhesive tape.

A further objective of the present invention is to provide a photosensitive semiconductor package and a method for fabricating the same, allowing the package to be fabricated by simple processes.

A further objective of the present invention is to provide a photosensitive semiconductor package and a method for fabricating the same, allowing an incorporated chip to be securely positioned in the package.

A further objective of the present invention is to provide a photosensitive semiconductor package and a method for fabricating the same, which can achieve a high yield.

In accordance with the above and other objectives, the present invention proposes a photosensitive semiconductor package according to a first preferred embodiment, comprising: a carrier having a first surface, a second surface opposite to the first surface, and an opening penetrating the carrier; a photosensitive chip having an active surface, a non-active surface opposite to the active surface, and a plurality of peripheral sides located between the active surface and the non-active surface, wherein a plurality of bond pads are formed at positions close to edges of the active surface of the photosensitive chip, and corner positions of the active surface are attached to the second surface of the carrier, with the bond pads on the active surface being exposed via the opening of the carrier; a plurality of bonding wires formed in the opening, for electrically connecting the bond pads of the photosensitive chip to the first surface of the carrier; a light-penetrable unit mounted on the active surface of the photosensitive chip and received in the opening; and an encapsulant for encapsulating the bonding wires and the peripheral sides of the photosensitive chip to seal the opening of the carrier.

In a second preferred embodiment, a photosensitive semiconductor package proposed in the present invention comprises a carrier having a first surface, a second surface opposite to the first surface, and an opening penetrating the carrier; a photosensitive chip having an active surface, a non-active surface opposite to the active surface, and a plurality of peripheral sides located between the active surface and the non-active surface, wherein a plurality of bond pads are formed at positions close to edges of the active surface of the photosensitive chip, and corner positions of the active surface are attached to the second surface of the carrier, with the bond pads on the active surface being exposed via the opening of the carrier; a plurality of bonding wires formed in the opening, for electrically connecting the bond pads of the photosensitive chip to the first surface of the carrier; an encapsulant for encapsulating the peripheral sides of the photosensitive chip; and a light-penetrable unit attached to the first surface of the carrier to cover the opening of the carrier.

Correspondingly, a method for fabricating the photosensitive semiconductor package according to the first preferred embodiment comprises the steps of preparing a carrier having a first surface, a second surface opposite to the first surface, and an opening penetrating the carrier; preparing a photosensitive chip having an active surface, a non-active surface opposite to the active surface, and a plurality of peripheral sides located between the active surface and the non-active surface, wherein a light-penetrable unit is mounted on the active surface, and a plurality of bond pads are formed at positions close to edges of the active surface; attaching the photosensitive chip via corner positions of the active surface thereof to the second surface of the carrier, such that the bond pads on the active surface of the photosensitive chip are exposed via the opening of the carrier and the light-penetrable unit is received in the opening; performing a wire-bonding process to electrically connect the bond pads of the photosensitive chip to the first surface of the carrier via a plurality of bonding wires; and performing an encapsulation process to form an encapsulant for encapsulating the bonding wires and the peripheral sides of the photosensitive chip to seal the opening of the carrier.

Moreover, a method for fabricating the photosensitive semiconductor package according to the second preferred embodiment comprises the steps of preparing a carrier having a first surface, a second surface opposite to the first surface, and an opening penetrating the carrier; preparing a photosensitive chip having an active surface, a non-active surface opposite to the active surface, and a plurality of peripheral sides located between the active surface and the non-active surface, wherein a plurality of bond pads are formed at positions close to edges of the active surface; attaching the photosensitive chip via corner positions of the active surface thereof to the second surface of the carrier, such that the bond pads on the active surface of the photosensitive chip are exposed via the opening; performing a wire-bonding process to electrically connect the bond pads of the photosensitive chip to the first surface of the carrier via a plurality of bonding wires; and forming an encapsulant to encapsulate the bonding wires and the peripheral sides of the photosensitive chip, and mounting a light-penetrable unit on the first surface of the carrier to cover the opening of the carrier.

The above-mentioned photosensitive chip is mounted via corner positions of its active surface to areas on the second surface of the carrier corresponding to corner of the opening, and areas on the active surface, other than the corner positions thereof, do not come into contact with the second surface of the carrier. A cutaway portion is formed at each of the corners of the opening, and complement areas are formed on the carrier corresponding to the corner cutaway portions of the opening, such that the corner positions of the chip are attached to the complement areas on the second surface of the carrier.

To achieve the above chip-mounting situation, the photosensitive chip can be shaped as a square chip having four corners, and the opening of the carrier can be shaped as a substantially square opening formed with cutaway portions at four corner thereof and is sized corresponding to the chip in a manner that the side length of the square chip is not larger than the side length of the substantially square opening, and the diagonal length of the square chip is larger than the diagonal length of the substantially square opening.

Therefore, the present invention utilizes the above dimensional designs and can solve the prior-art problem of being difficult to position a photosensitive chip. The present invention does not require any adhesive tape during the fabrication processes, and employs the low-cost and high-yield wire-bonding technique without formation of conductive bumps, so as to reduce the overall thickness and the fabrication cost of the semiconductor package, and achieve a high yield and easy mass production.

BRIEF DESCRIPTION OF THE DRAWINGS

The present invention can be more fully understood by reading the following detailed description of the preferred embodiments, with reference made to the accompanying drawings, wherein:

FIGS. 1A to 1H are schematic diagrams showing the procedural steps of a method for fabricating a photosensitive semiconductor package according to a first preferred embodiment of the present invention, wherein FIG. 1B is a top view of a carrier and FIG. 1C is a top view of a photosensitive chip used in the package;

DETAILED DESCRIPTION OF THE PREFERED EMBODIMENTS

First Preferred Embodiment

Figure 1A:
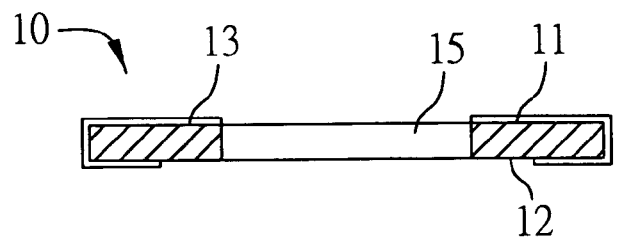
Figure 1B:
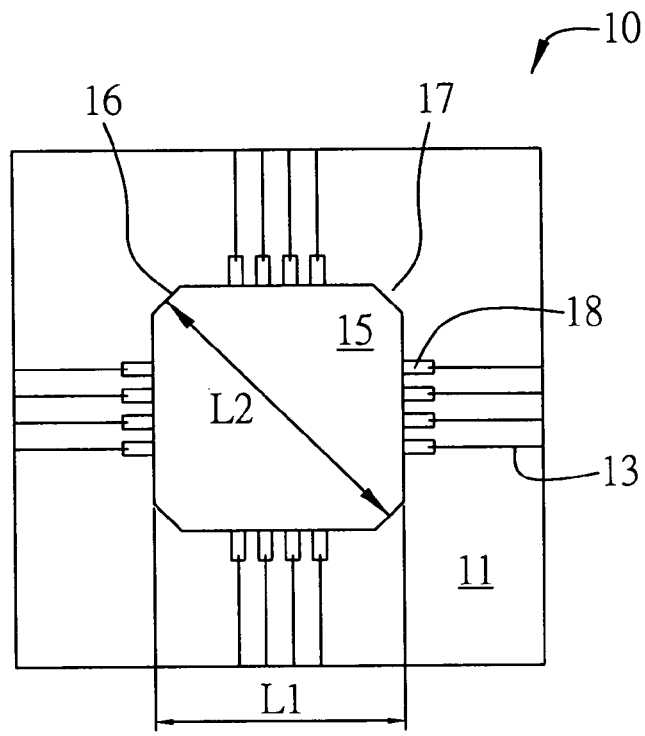

FIGS. 1A to 1H show the procedural steps of a method for fabricating a photosensitive semiconductor package according to a first preferred embodiment of the present invention. First referring to FIG. 1A, a carrier 10 such as a substrate is prepared, which has a first surface 11, a second surface 12 opposite to the first surface 11, and an opening 15 penetrating a central portion of the carrier 10. A conductive trace layer 13 is formed on the first and second surfaces 11, 12 of the carrier 10. As shown in FIG. 1B, the opening 15 is shaped as a substantially square with four corners thereof being each formed with a cutaway portion 16, and positions of the carrier 10 corresponding to the four corner cutaway portions 16 of the opening 15 are formed with complement areas 17. Also, a plurality of bond fingers 18 are formed on the first surface 11 of the carrier 10 at positions adjacent to the edges of the opening 15 and are electrically connected to the conductive trace layer 13; the bond fingers 18 are to be electrically connected to a photosensitive chip 20 subsequently mounted on the carrier 10.

Figure 1C:
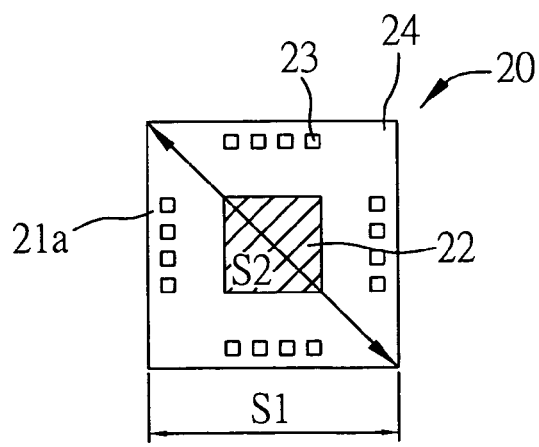

FIG. 1C shows an active surface 21a of the photosensitive chip 20 that is to be later mounted on the carrier 10. As shown in FIG. 1C, a photosensitive area 22 is formed at a central position of the active surface 21a of the chip 20 that is substantially shaped as a square, and a plurality of bond pads 23 are provided at positions close to the four edges of the active surface 21a, wherein the four corners of the active surface 21a are not occupied by the bond pads 23 and are referred to as attach areas 24. A light-penetrable unit 25 such as glass (FIG. 1D) is mounted on the photosensitive area 22 to prevent the photosensitive area 22 from being contaminated by dust. The photosensitive chip 20 may be an image sensor chip having the photosensitive area 22 receive external light entering through the light-penetrable unit 25. Moreover, the chip 20 is sized according to the size of the opening 15 of the carrier 10 in a manner that, the side length S1 of the square chip 20 is not larger than the side length L1 of the substantially square opening 15, and the diagonal length S2 of the square chip 20 is larger than the diagonal length L2 of the substantially square opening 15 as shown in FIGS. 1B and 1C.

Figure 1D:
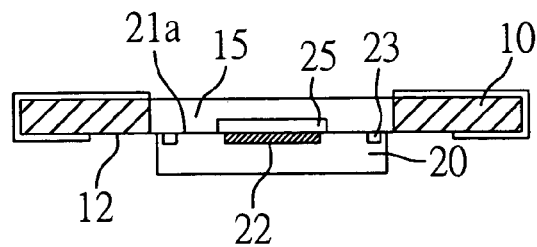
Figure 1E:
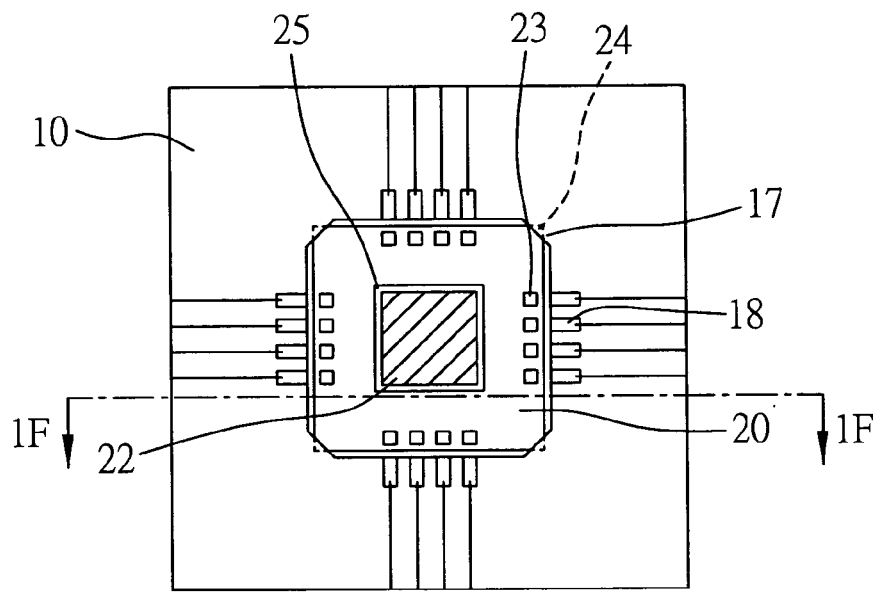

By the above dimensional arrangement, referring to FIGS. 1D and 1E, an adhesive can be applied on the complement areas 17 of the second surface 12 of the carrier 10, allowing the attach areas 24 at the four corners of the active surface 21a of the chip 20 to be attached to the complement areas 17 on the second surface 12 of the carrier 10 via the adhesive. As a result, areas on the active surface 21a, other than the corner attach areas 24, are close to the opening 15 and not in contact with the second surface 12 of the carrier 10, and the light-penetrable unit 25 is received in the opening 15. Since the side length S1 of the chip 20 is not larger than the side length L1 of the opening 15, the bond pads 23 located close to the edges of the active surface 21a of the chip 20 are exposed via the opening 15 and not in contact with the second surface 12 of the carrier 10, as shown in FIG. 1E. Also since the diagonal length S2 of the chip 20 is larger than the diagonal length L2 of the opening 15, the four corner attach areas 24 of the chip 20 can indeed come into contact with the four complement areas 17 on the second surface 12 of the carrier 10, such that the chip 20 is securely positioned and attached to the carrier 10, which solves the prior-art problem concerning the positioning of a photosensitive chip and does not require any adhesive tape used in the prior art.

Figure 1F:
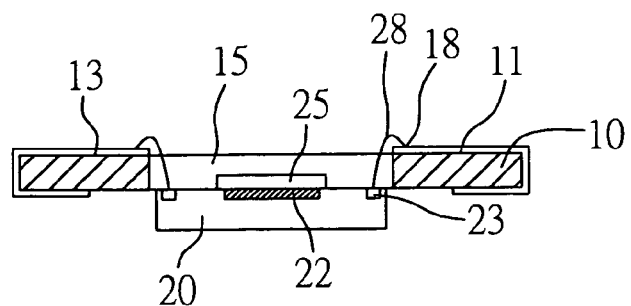
Figure 1G:
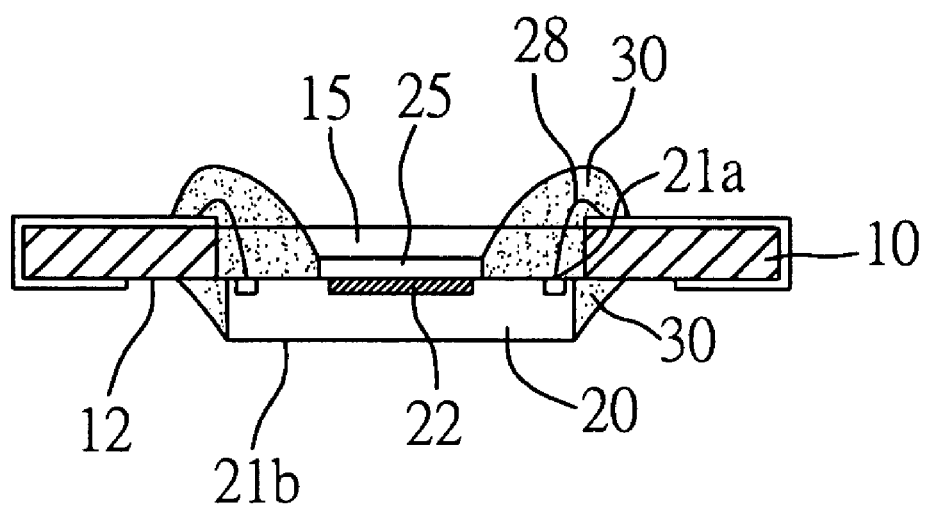

Next, referring to FIG. 1F, a wire-bonding process is performed to form a plurality of bonding wires 28 in the opening 15 of the carrier 10, and the bonding wires 28 electrically connect the bond pads 23 of the photosensitive chip 20 to the bond fingers 18 on the first surface 11 of the carrier 10. As a result, the light received by the photosensitive area 22 of the chip 20 can be converted into an electrical signal that is transmitted to the conductive trace layer 13 on the carrier 10 via the bonding wires 28. Referring to FIG. 1G, an encapsulating process is performed to form an encapsulant 30 for encapsulating the bonding wires 28 and the active surface 21a of the chip 20 so as to protect the active surface 21a against external damage or contamination. The light-penetrable unit 25 mounted on the photosensitive area 22 is not encapsulated by the encapsulant 30 and is exposed. The encapsulant 30 is also formed on the second surface 12 of the carrier 10 and encapsulates peripheral sides of the chip 20 to secure the positioning of the chip 20, wherein the peripheral sides of the chip 20 are located between the active surface 21a and a non-active surface 21b opposite to the active surface 21a of the chip 21. Finally referring to FIG. 1H, a ball implantation process is carried out to implant a plurality of solder balls 31 on the second surface 12 of the carrier 10 according to a pre-determined circuit layout on the carrier 10, so as to allow the electrical signal to be transmitted from the conductive trace layer 13 to an external electronic device such as printed circuit board (PCB, not shown) through the solder balls 31. Therefore, when the photosensitive chip 20 is an image sensor chip, the external light can pass through the light-penetrable unit 25, the photosensitive area 22, the bond pads 23, the bonding wires 28, the bond fingers 18 on the first surface 11 of the carrier 10, the conductive trace layer 13 and the solder balls 31, to allow the light to be converted into an electrical signal and transmitted to the external PCB, thereby achieving the effect of the photosensitive semiconductor package.

Figure 1H:
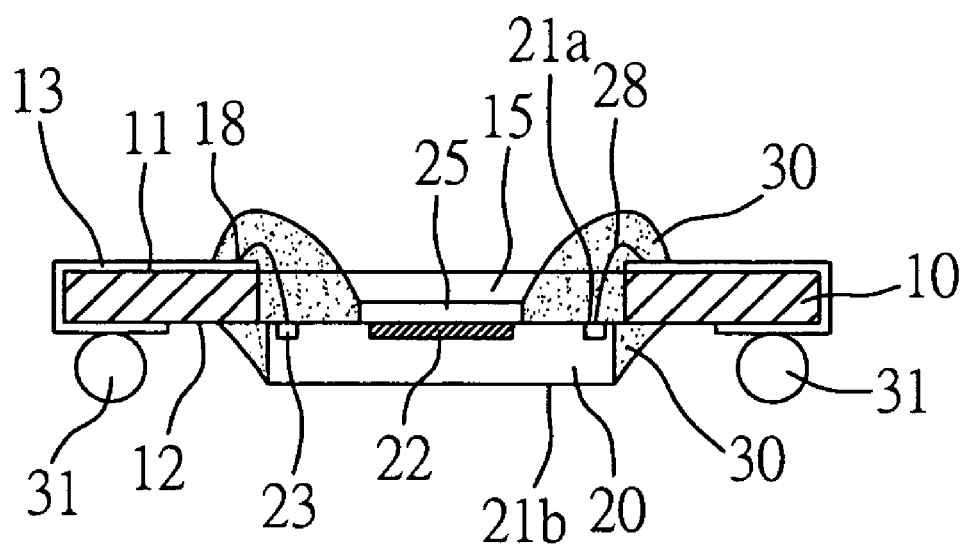

The fabricated photosensitive semiconductor package according to the first preferred embodiment as shown in FIG. 1H comprises a carrier 10 having a first surface 11, a second surface 12 opposite to the first surface 11, and an opening 15 penetrating a central portion of the carrier 10. A photosensitive chip 20 is attached via corner attach areas 24 on its active surface 21a to the second surface 12 of the carrier 10, wherein areas on the active surface 21a, other than the attach areas 24, are close to the opening 15 and not in contact with the second surface 12 of the carrier 10. Moreover, the chip 20 is electrically connected to the first surface 11 of the carrier 10 via a plurality of bonding wires 28 formed in the opening 15, and a light-penetrable unit 25 is mounted on the active surface 21a of the chip 20 and received in the opening 15. The semiconductor package further comprises an encapsulant 30 for encapsulating the bonding wires 28, the active surface 21a of the chip 20, and peripheral sides of the chip 20; and a plurality of solder balls 31 implanted on the second surface 12 of the carrier 10.

According to the dimensional arrangement of the chip 20 and the opening 15 of the carrier 10 in the present invention, the prior-art problem associated with positioning of the photosensitive chip can be solved, and no adhesive tape used in the prior art to temporarily position the chip is required in the fabrication processes. Further, in the use of the low-cost and high-yield wire-bonding technique, conductive bumps formed in the prior art are not required in the present invention. Therefore, the present invention can fabricate a thin and compact semiconductor package by simple processes and with low cost, thereby solving many packaging problems in the prior art.

Figure 2A:
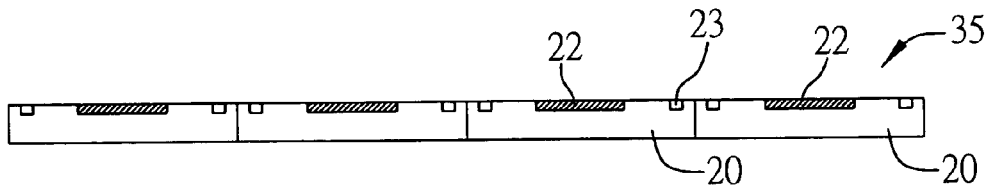
FIGS. 2A to 2C are cross-sectional diagrams showing the procedural steps of a method for fabricating the photosensitive chips in a batch manner according to the first preferred embodiment of the present invention.
Figure 2B:
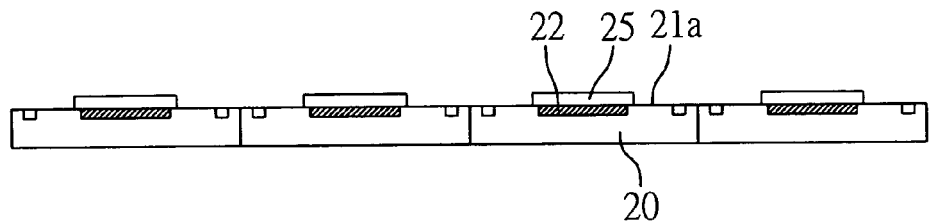
Figure 2C:
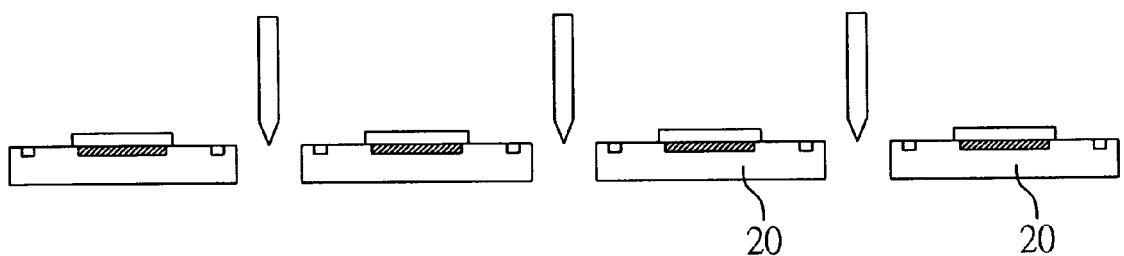

The above photosensitive chip 20 is generally manufactured in a batch manner as shown in FIG. 2A. First, a wafer 35 completed with semiconductor processing is prepared and pre-defined with a plurality of chips 20. Each of the chips 20 is formed with a photosensitive area 22, a conductive trace layer (not shown), and a plurality of bond pads 23 thereon. Next, referring to FIG. 2B, a light-penetrable unit 25 is attached to the photosensitive area 22 of each of the chips 20 by an automated process. The light-penetrable unit 25 may be a glass plate, an infrared (IR) filter, or a light-penetrable material layer coated on the photosensitive area 22 of each of the chips 20. Referring to FIG. 2C, a cutting process is performed to cut the wafer 35 and separate apart the plurality of chips 20 to form a number of individual chips 20 depending on the size of the wafer 35.

Figure 3:
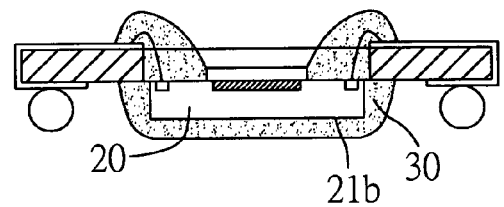
FIG. 3 is a cross-sectional diagram of another structure of the photosensitive semiconductor package according to the first preferred embodiment of the present invention.
Figure 4:
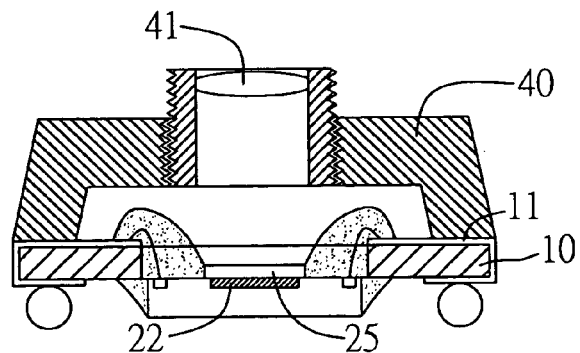
FIG. 4 is a cross-sectional diagram of an image sensor module fabricated according to the first preferred embodiment of the present invention.

Apart from the package structure shown in FIG. 1H, the encapsulant 30 of the photosensitive semiconductor package may completely cover the non-active surface 21b of the chip 20 as shown in FIG. 3 to further protect the chip 20 and secure the positioning of the chip 20. Moreover, as shown in FIG. 4, a lens holder 40 can be mounted on the first surface 11 of the carrier 10, allowing a lens of the lens holder 40 to be located above and spaced apart from the light-penetrable unit 25. The lens 41 corresponds in position to the photosensitive area 22 below the light-penetrable unit 25, such that external light can be focused by the lens 41 and transmitted via the light-penetrable unit 25 to the photosensitive area 22. This arrangement provides an image sensor module as shown in FIG. 4.

Second Preferred Embodiment

Figure 5A:
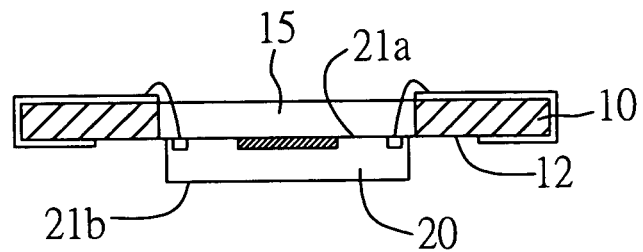
FIGS. 5A to 5D are cross-sectional diagrams showing the procedural steps of a method for fabricating a photosensitive semiconductor package according to a second preferred embodiment of the present invention.
Figure 5B:
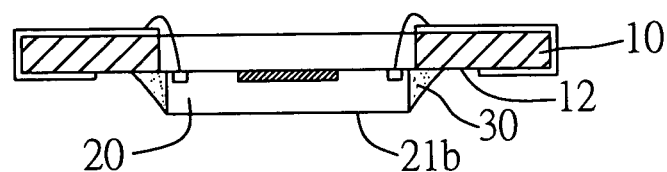
Figure 5C:
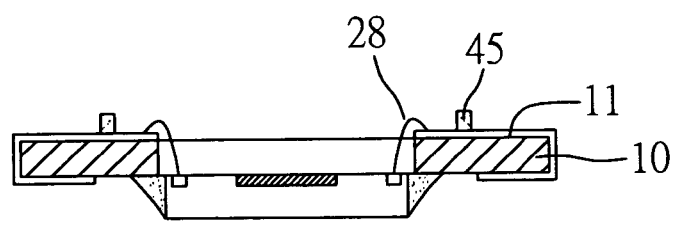
Figure 5D:
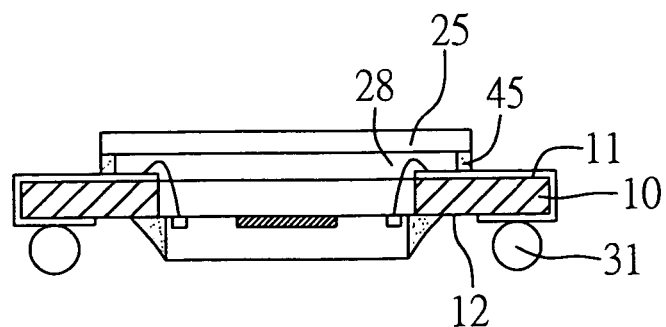

A second preferred embodiment of the present invention differs from the above first embodiment in that the light-penetrable unit 25 is not directly attached to the photosensitive chip 20. In the second embodiment, the light-penetrable unit 25 is mounted on the carrier 10 to cover the opening 15, such that a used amount of material for the encapsulant 30 would be reduced. A fabrication method for a photosensitive semiconductor package according to the second embodiment is shown in FIGS. 5A to 5D. First, referring to FIG. 5A, a photosensitive chip 20 is mounted to the second surface 12 of the carrier 10, allowing the active surface 21a of the chip 20 to be close to the opening 15 of the carrier 10, wherein the four corner attach areas 24 on the active surface 21a of the chip 20 are attached to the complement areas 17 on the second surface 12 of the carrier 10 in a similar manner as shown in FIG. 1E, except that no light-penetrable unit is provided on the active surface 21a of the chip 20. Then, a wire-bonding process is performed to electrically connect the active surface 21a of the chip 20 to the first surface 11 of carrier 10 via the bonding wires 28. Next, referring to FIG. 5B, an encapsulation process is performed to form an encapsulant 30 on the second surface 12 of the carrier 10 for encapsulating the peripheral sides of the chip 20 so as to fix the chip 20 in position. Further, referring to FIG. 5C, a dam 45 made of e.g. an adhesive is formed on the first surface 11 of the carrier 10 around the bonding wires 28, wherein the dam 45 is preferably higher than the loops of the bonding wires 28. Finally referring to FIG. 5D, a light-penetrable unit 25 is mounted on the first surface 11 of the carrier 10 and attached to the dam 45, such that the light-penetrable unit 25 is positioned above the carrier 10 via the dam 45 without coming into contact with the bonding wires 28. A plurality of solder balls 31 are implanted on areas of the second surface 12 of the carrier 10 not covered by the encapsulant 30. This completes the fabrication of the photosensitive semiconductor package according to the second embodiment of the present invention as shown in FIG. 5D.

Third Preferred Embodiment

Figure 6A:
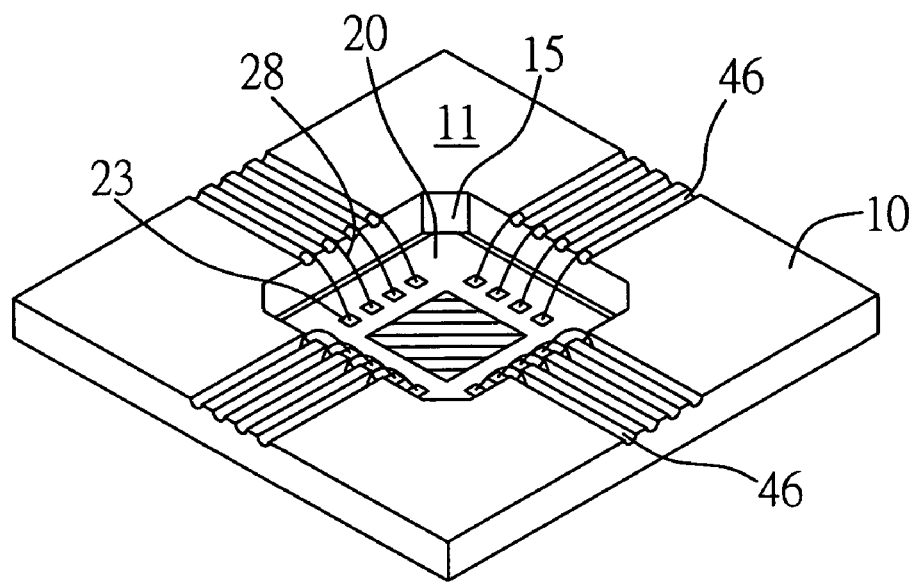
FIGS. 6A and 6B are schematic diagrams showing the procedural steps of a method for fabricating a photosensitive semiconductor package according to a third preferred embodiment of the present invention.
Figure 6B:
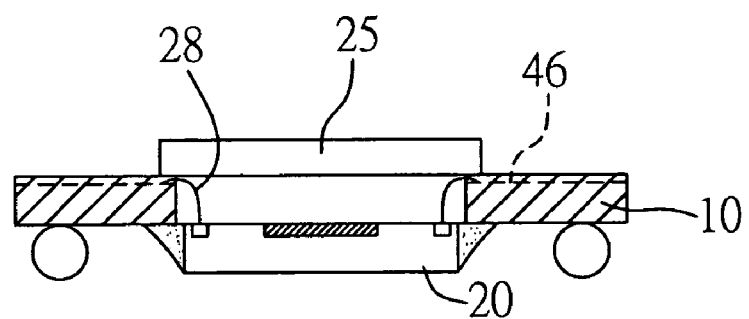

An alternative to the dam 45 in the above second embodiment for preventing the light-penetrable unit 25 from contacting the bonding wires 28 is to form a plurality of recessed bond fingers 46 in a third preferred embodiment of the present invention as shown in FIG. 6A. The recessed bond fingers 46, in place of the bond fingers 18 in the above first embodiment, are located on the first surface 11 of the carrier 10 and adjacent to the edges of the opening 15. The recessed bond fingers 46 correspond to the bond pads 23 of the photosensitive chip 20 and are electrically connected to the conductive trace layer (not shown) on the carrier 10. When the chip 20 is mounted via its corner positions to the carrier 10, the bond pads 23 exposed via the opening 15 can be electrically connected to the corresponding recessed bond fingers 46 by the bonding wires 28. The recessed bond fingers 46 are sized to allow the loops of the bonding wires 28 not to be protruded from the first surface 11 of the carrier 10, such that as shown in FIG. 6B, the light-penetrable unit 25 mounted on the first surface 11 of the carrier 10 would not come into contact with the bonding wires 28. This arrangement does not require the dam 45 used in the above second embodiment and thus saves the material and fabrication cost for the dam 45.

Figure 7:
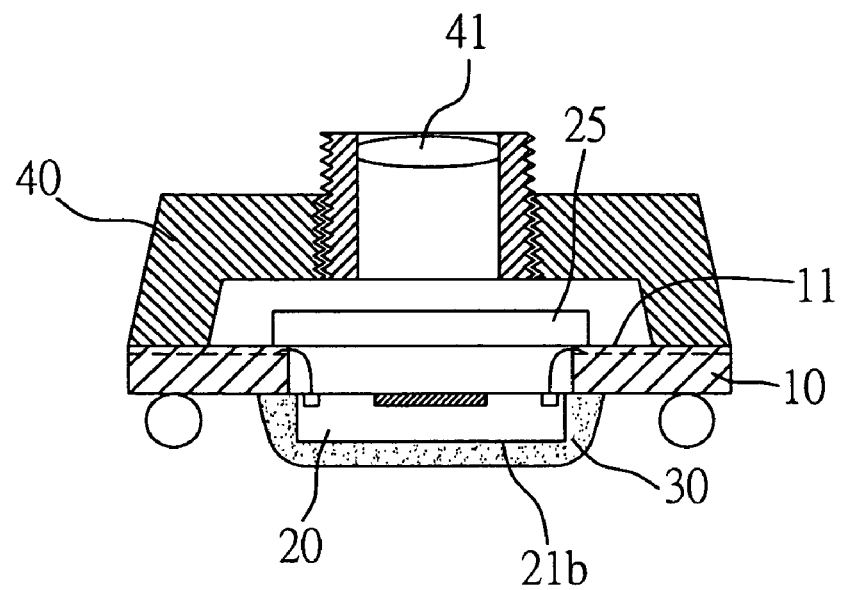
FIG. 7 is a cross-sectional diagram of an image sensor module fabricated according to the third preferred embodiment of the present invention.

Alternatively, for the package structure described in the second or third embodiment having the light-penetrable unit 25 mounted on the carrier 10, similarly to the above description for FIGS. 3 and 4, the encapsulant 30 in the second or third embodiment may completely cover the non-active surface 21b of the chip 20 as shown in FIG. 7 (using the third embodiment as an example), and a lens holder 40 having a lens 41 can be disposed on the first surface 11 of the carrier 10 to fabricate an image sensor module and achieve functional integration.

Other Preferred Embodiments of the Carrier

Figure 8:
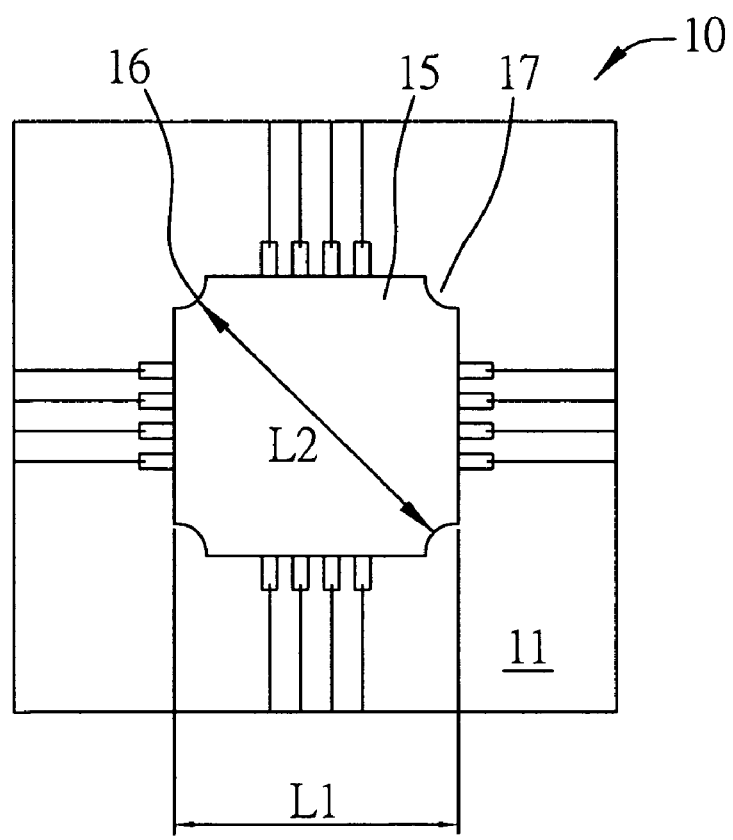
FIG. 8 is a top view of the carrier according to another preferred embodiment of the present invention.
Figure 9:
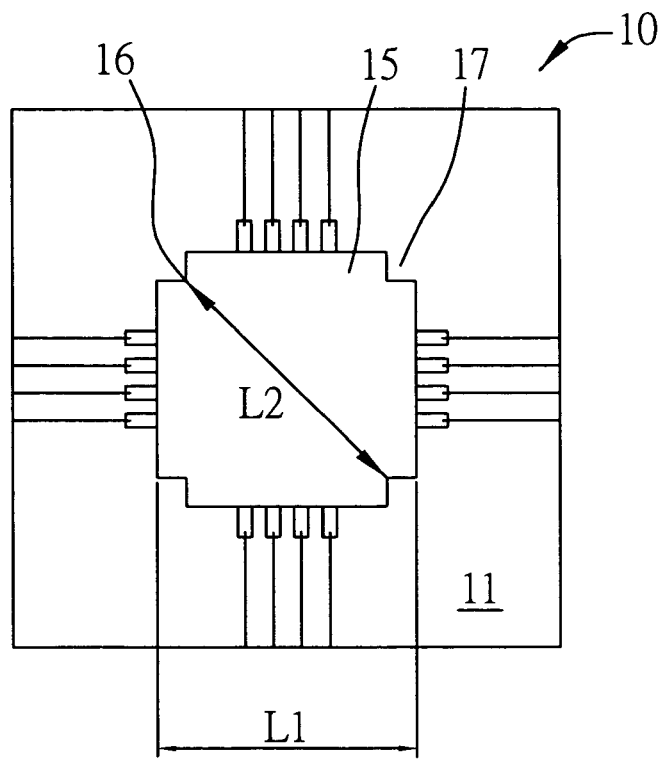
FIG. 9 is a top view of the carrier according to yet another preferred embodiment of the present invention.
Figure 10:
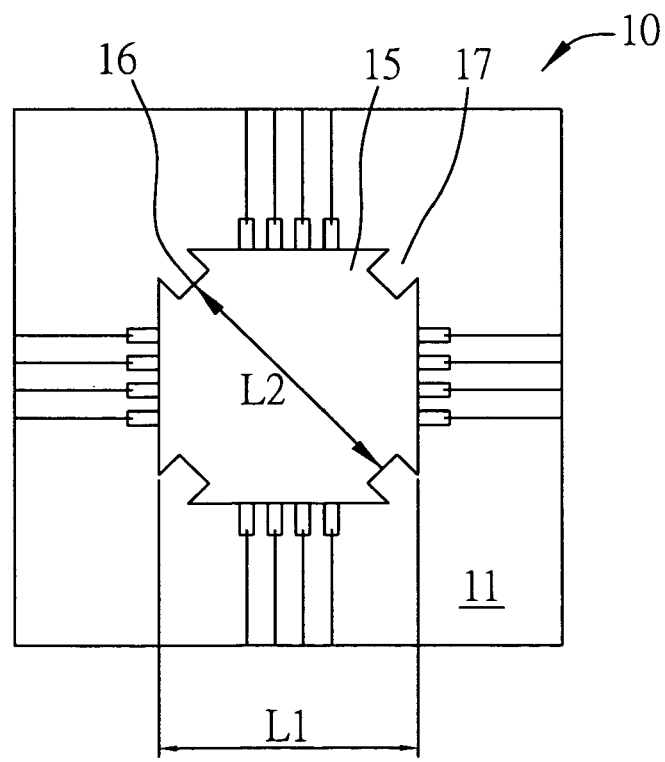
FIG. 10 is a top view of the carrier according to a further preferred embodiment of the present invention.
Figure 11:
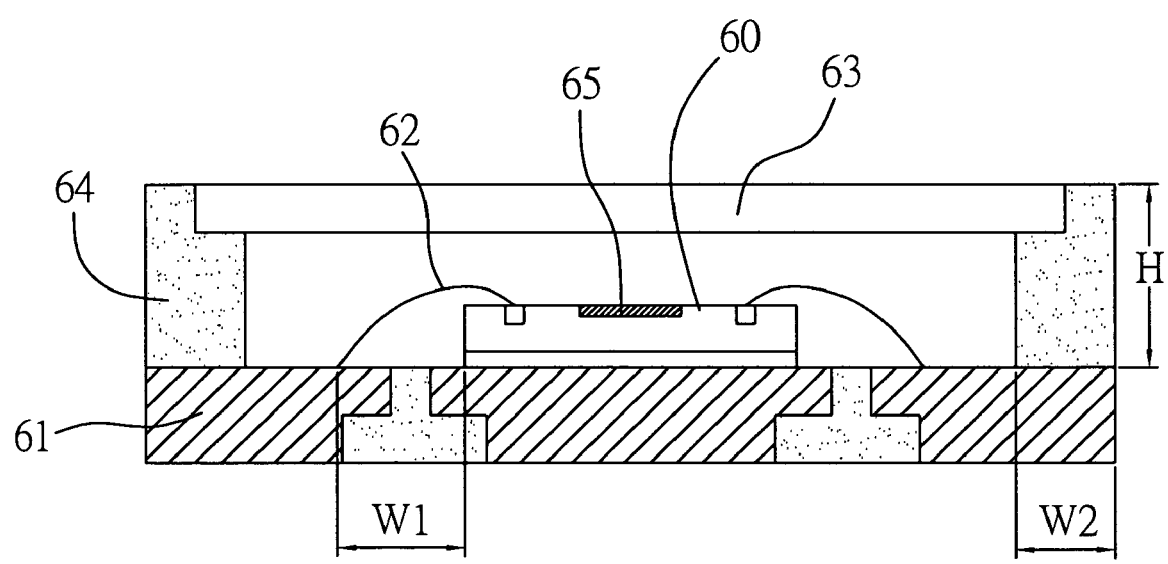
FIG. 11 (PRIOR ART) is a cross-sectional diagram of a semiconductor package disclosed in U.S. Pat. No. 6,384,472.
Figure 12A:
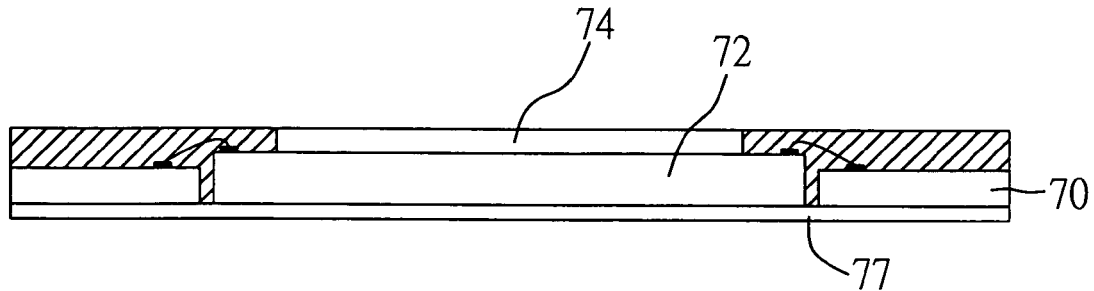
FIGS. 12A to 12C (PRIOR ART) are cross-sectional diagrams showing the procedural steps of a method for fabricating a semiconductor package disclosed in U.S. Pat. No. 6,586,824.
Figure 12B:
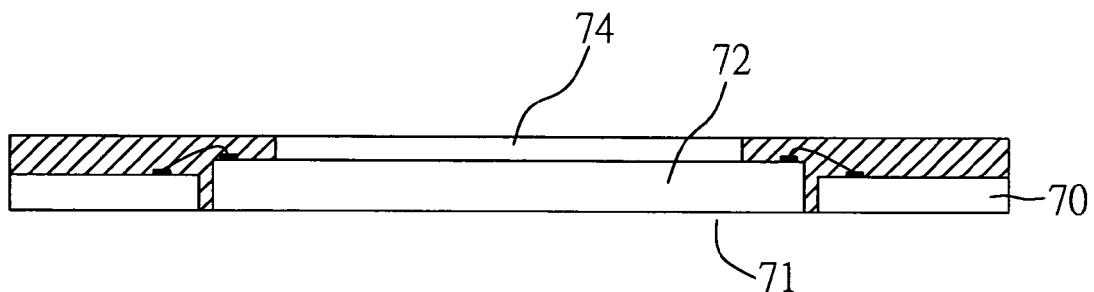
Figure 12C:
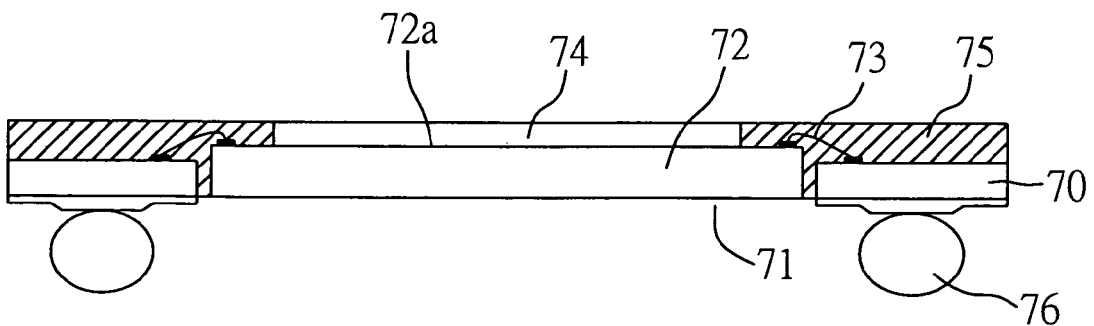
Figure 13:
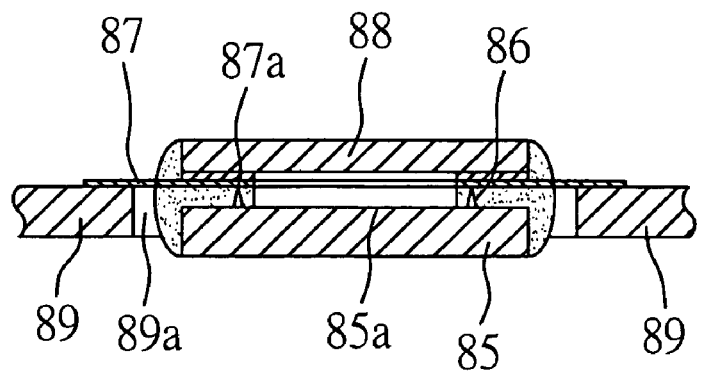
FIG. 13 (PRIOR ART) is a cross-sectional diagram of a semiconductor package disclosed in U.S. Pat. No. 6,646,316.
Figure 14:
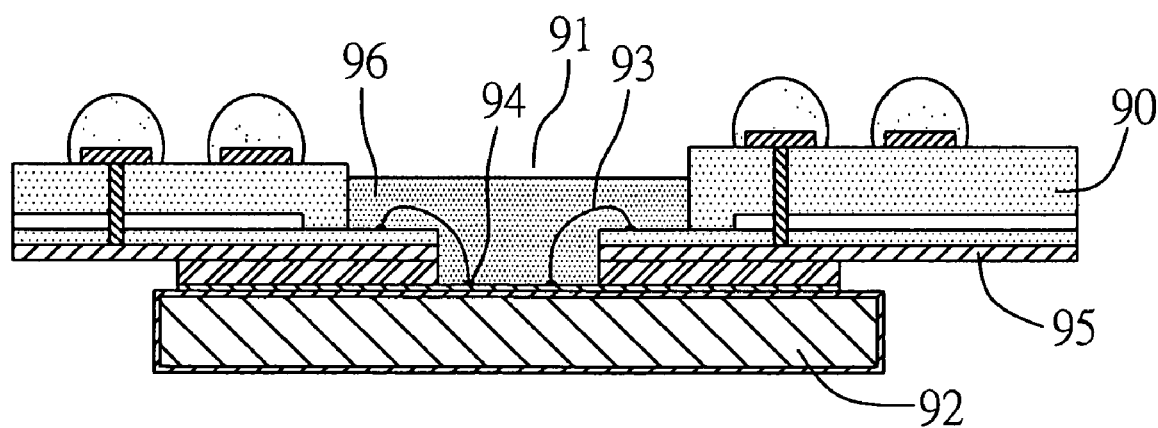
FIG. 14 (PRIOR ART) is a cross-sectional view of a conventional SOC package.
Figure 15:
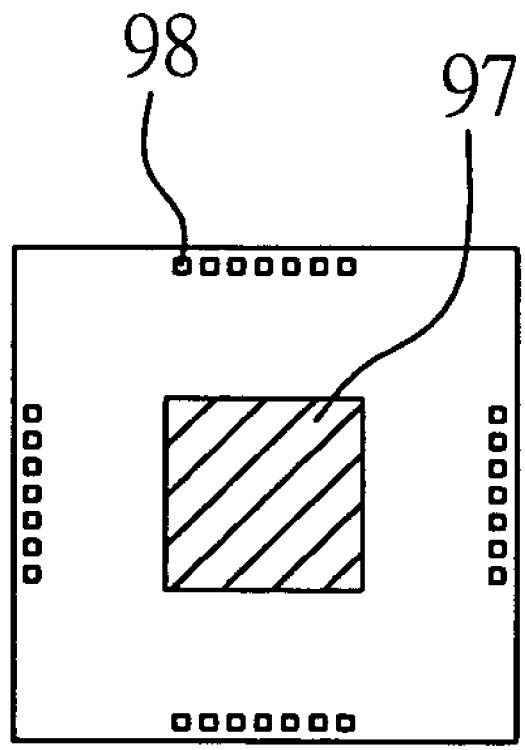
FIG. 15 (PRIOR ART) is a top view of an active surface of a photosensitive chip.

According to the present invention, the carrier 10 is formed with an opening 15 dimensioned to correspond to the size of the chip 20 in a manner that the side length of the opening 15 is larger than or equal to the side length of the chip 20, and the diagonal length of the opening 15 is smaller than the diagonal length of the chip 20, such that the chip 20 can be mounted over the opening 15 without interference with bond pads 23 formed on the chip 20. Therefore, any carrier 10 that meets the above dimensioned criteria is applicable to the present invention. FIG. 8 shows a top view of a carrier 10 having a substantially square opening 15, wherein a rounded cutaway portion 16 is formed at each of four corners of the opening 15, and complement areas 17 are formed on the carrier 10 corresponding to the cutaway portions 16 of the opening 15, wherein the side length S1 of the chip 20 is not larger than the side length L1 of the opening 15, and the diagonal length S2 of the chip 20 is larger than the diagonal length L2 of the opening 15, such that the four corners 24 of the chip 20 can be attach to the complement areas 17 of the carrier 10. Alternatively, FIG. 9 shows a top view of another carrier 10 having square cutaway portions 16 formed the four corners thereof, wherein the side length S1 of the chip 20 (FIG. 1C) is not larger than the side length L1 of the opening 15, and the diagonal length S2 of the chip 20 is larger than the diagonal length L2 of the opening 15, such that the chip 20 can be attached to and positioned on the carrier 10. FIG. 10 shows a top view of a further carrier 10 having a diagonally square cutaway portions 16 formed at the four corners thereof, wherein the side length S1 of the chip 20 is not larger than the side length L1 of the opening 15, and the diagonal length S2 of the chip 20 is larger than the diagonal length L2 of the opening 15 in order to achieve a similar effect on mounting the chip 20.

Therefore, the present invention utilizes the corresponding dimension designs of the opening 15 of the carrier 10 and the chip 20, which can solve the limitation on mounting a photosensitive chip having a central photosensitive area and peripheral bond pads in the prior art. The above embodiments illustrate the use of the substantially square opening 15 of the carrier 10 and the square chip 20, which do not set a limitation for the present invention. It should be understood that other shapes of the opening in the carrier and mounting the chip via other peripheral areas thereof not having the bond pads are also suitable in the present invention.

In conclusion, the photosensitive semiconductor package and the fabrication method thereof in the present invention through the use of the dimensional designs and the wire-bonding technique do not require any adhesive tape or formation of conductive bumps in the fabrication processes, thereby solving the prior-art problems, and can advantageously reduce the overall thickness and the fabrication cost of the package so as to achieve a high yield and easy mass production.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A photosensitive semiconductor package, comprising:
    a carrier having a first surface, a second surface opposite to the first surface, and an opening penetrating the carrier, wherein corners of the opening are each formed with a cutaway portion, and a complement area is formed on the second surface at a position corresponding to each of the cutaway portions of the corners of the opening;
    a photosensitive chip having an active surface, a non-active surface opposite to the active surface, and a plurality of peripheral sides located between the active surface and the non-active surface, wherein a plurality of bond pads are formed at positions close to edges of the active surface of the photosensitive chip, and corner positions of the active surface are attached to the complement areas on the second surface of the carrier, with the bond pads on the active surface being exposed via the opening of the carrier;
    a plurality of bonding wires formed in the opening, for electrically connecting the bond pads of the photosensitive chip to the first surface of the carrier;
    a light-penetrable unit mounted on the active surface of the photosensitive chip and received in the opening; and
    an encapsulant for encapsulating the bonding wires and the peripheral sides of the photosensitive chip to seal the opening of the carrier.

2. The photosensitive semiconductor package of claim 1, wherein the encapsulant completely covers the non-active surface of the photosensitive chip.

3. The photosensitive semiconductor package of claim 1, wherein a plurality of solder balls are implanted on the second surface of the carrier.

4. The photosensitive semiconductor package of claim 1, further comprising a lens holder mounted on the first surface of the carrier and comprising a lens spaced apart from the light-penetrable unit.

5. A photosensitive semiconductor package, comprising:
    a carrier having a first surface, a second surface opposite to the first surface, and an opening penetrating the carrier, wherein corners of the opening are each formed with a cutaway portion, and a complement area is formed on the second surface at a position corresponding to each of the cutaway portions of the corners of the opening;
    a photosensitive chip having an active surface, a non-active surface opposite to the active surface, and a plurality of peripheral sides located between the active surface and the non-active surface, wherein a plurality of bond pads are formed at positions close to edges of the active surface of the photosensitive chip, and corner positions of the active surface are attached to the complement areas on the second surface of the carrier, with the bond pads on the active surface being exposed via the opening of the carrier;
    a plurality of bonding wires formed in the opening, for electrically connecting the bond pads of the photosensitive chip to the first surface of the carrier;
    an encapsulant for encapsulating the peripheral sides of the photosensitive chip; and
    a light-penetrable unit attached to the first surface of the carrier to cover the opening of the carrier.

6. The photosensitive semiconductor package of claim 5, wherein a dam is formed on the first surface of the carrier surrounding the bonding wires, and the light-penetrable unit is attached to the dam and free of contact with the bonding wires.

7. The photosensitive semiconductor package of claim 5, wherein a plurality of recessed bond fingers are formed on the first surface of the carrier, such that the bonding wires electrically connect the recessed bond fingers to the bond pads of the photosensitive chip, and the light-penetrable unit is free of contact with the bonding wires.

8. The photosensitive semiconductor package of claim 5, wherein the encapsulant completely covers the non-active surface of the photosensitive chip.

9. The photosensitive semiconductor package of claim 5, wherein a plurality of solder balls are implanted on the second surface of the carrier.

10. The photosensitive semiconductor package of claim 5, further comprising a lens holder mounted on the first surface of the carrier and comprising a lens spaced apart from the light-penetrable unit.

11. A method for fabricating a photosensitive semiconductor package, comprising the steps of:
    preparing a carrier having a first surface, a second surface opposite to the first surface, and an opening penetrating the carrier, wherein corners of the opening are each formed with a cutaway portion, and a complement area is formed on the second surface at a position corresponding to each of the cutaway portions of the corners of the opening;

preparing a photosensitive chip having an active surface, a non-active surface opposite to the active surface, and a plurality of peripheral sides located between the active surface and the non-active surface, wherein a light-penetrable unit is mounted on the active surface, and a plurality of bond pads are formed at positions close to edges of the active surface;

attaching the photosensitive chip via corner positions of the active surface thereof to the complement areas on the second surface of the carrier, such that the bond pads on the active surface of the photosensitive chip are exposed via the opening of the carrier and the light-penetrable unit is received in the opening;

performing a wire-bonding process to electrically connect the bond pads of the photosensitive chip to the first surface of the carrier via a plurality of bonding wires; and performing an encapsulation process to form an encapsulant for encapsulating the bonding wires and the peripheral sides of the photosensitive chip to seal the opening of the carrier.

12. The method of claim 11, wherein the encapsulant completely covers the non-active surface of the photosensitive chip.

13. The method of claim 11, further comprising implanting a plurality of solder balls on the second surface of the carrier.

14. The method of claim 11, further comprising mounting a lens holder on the first surface of the carrier, the lens holder comprising a lens spaced apart from the light-penetrable unit.

15. A method for fabricating a photosensitive semiconductor package, comprising the steps of:

preparing a carrier having a first surface, a second surface opposite to the first surface, and an opening penetrating the carrier, wherein corners of the opening are each formed with a cutaway portion, and a complement area is formed on the second surface at a position corresponding to each of the cutaway portions of the corners of the opening;

preparing a photosensitive chip having an active surface, a non-active surface opposite to the active surface, and a plurality of peripheral sides located between the active surface and the non-active surface, wherein a plurality of bond pads are formed at positions close to edges of the active surface;

attaching the photosensitive chip via corner positions of the active surface thereof to the complement areas on the second surface of the carrier, such that the bond pads on the active surface of the photosensitive chip are exposed via the opening;

performing a wire-bonding process to electrically connect the bond pads of the photosensitive chip to the first surface of the carrier via a plurality of bonding wires; and forming an encapsulant to encapsulate the bonding wires and the peripheral sides of the photosensitive chip, and mounting a light-penetrable unit on the first surface of the carrier to cover the opening of the carrier.

16. The method of claim 15, wherein a dam is formed on the first surface of the carrier surrounding the bonding wires, and the light-penetrable unit is attached to the dam and free of contact with the bonding wires.

17. The method of claim 15, wherein a plurality of recessed bond fingers are formed on the first surface of the carrier, such that the bonding wires electrically connect the recessed bond fingers to the bond pads of the photosensitive chip, and the light-penetrable unit is free of contact with the bonding wires.

18. The method of claim 15, wherein the encapsulant completely covers the non-active surface of the photosensitive chip.

19. The method of claim 15, further comprising implanting a plurality of solder balls on the second surface of the carrier.

20. The method of claim 15, further comprising mounting a lens holder on the first surface of the carrier, the lens holder comprising a lens spaced apart from the light-penetrable unit.

* * * * *